United States Patent [19]

Toyoda et al.

[11] Patent Number: 4,472,872
[45] Date of Patent: Sep. 25, 1984

[54] METHOD OF FABRICATING A SCHOTTKY GATE FIELD EFFECT TRANSISTOR

[75] Inventors: Nobuyuki Toyoda, Yokohama; Toshiyuki Terada, Kawasaki; Takamaro Mizoguchi; Akimichi Hojo, both of Yokohama, all of Japan

[73] Assignee: Tokyo Shibaura Denki Kabushiki Kaisha, Kawasaki, Japan

[21] Appl. No.: 523,600

[22] Filed: Aug. 16, 1983

[30] Foreign Application Priority Data

Dec. 21, 1982 [JP] Japan .................................. 57-224163

[51] Int. Cl.³ .......................................... H01L 21/24
[52] U.S. Cl. ...................................... 29/571; 29/578; 148/187
[58] Field of Search .................... 148/187; 29/571, 578

[56] References Cited

U.S. PATENT DOCUMENTS

| | | | |
|---|---|---|---|
| 4,266,333 | 5/1981 | Reichert | 29/578 X |
| 4,359,816 | 11/1982 | Abbas et al. | 29/578 X |
| 4,377,899 | 3/1983 | Otani et al. | 29/571 |
| 4,426,767 | 1/1984 | Swanson et al. | 29/571 |

OTHER PUBLICATIONS

IEEE Trans. On Electron Devices, Vol. Ed.-29, No. 4, pp. 590-596, Apr. 1982, "Fabrication of High-Performance LDDFET's with Oxide Sidewall-Spacer Technology".

Primary Examiner—G. Ozaki
Attorney, Agent, or Firm—Oblon, Fisher, Spivak, McClelland & Maier

[57] ABSTRACT

A Schottky gate FET is fabricated by forming on a semiconductor substrate first and second stacks facing each other. Each stack is constructed by an ohmic electrode and a spacer film. On the substrate having stacks formed thereon an insulation layer is formed and is anisotropically etched in the direction of its thickness until the planar surface portions are exposed. As a result, portions of the insulation layer remain on opposing side walls of the stacks. After removing the spacer films to define stepped portions between each remaining portion and each electrode, a layer of a metallic material capable of forming a Schottky barrier with the substrate is formed. The remaining portions are removed to pattern the metallic material layer, thereby forming a Shottky gate electrode.

17 Claims, 10 Drawing Figures

F I G. 2D
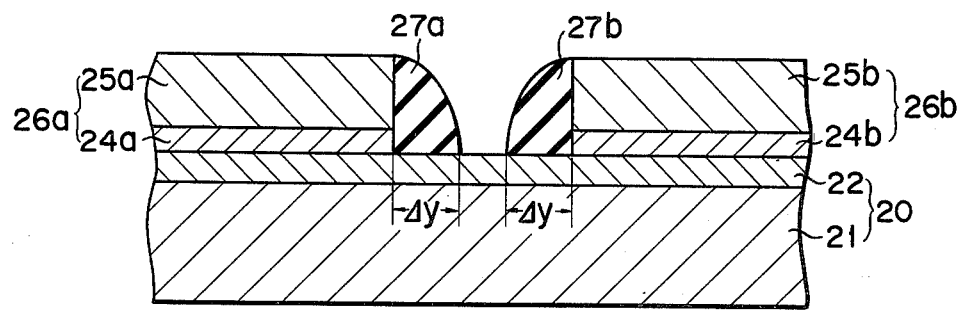
F I G. 2E
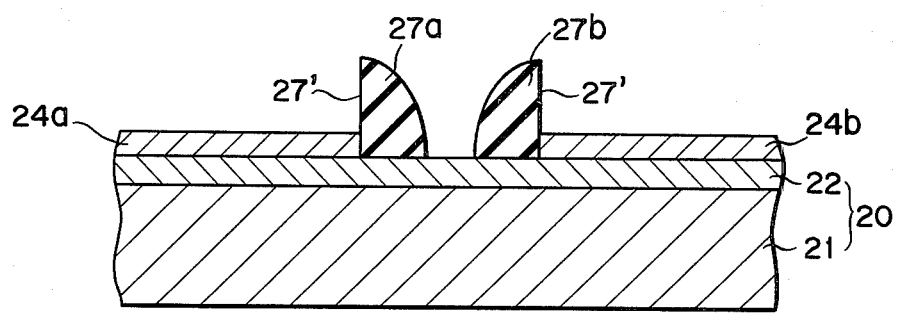
F I G. 2F
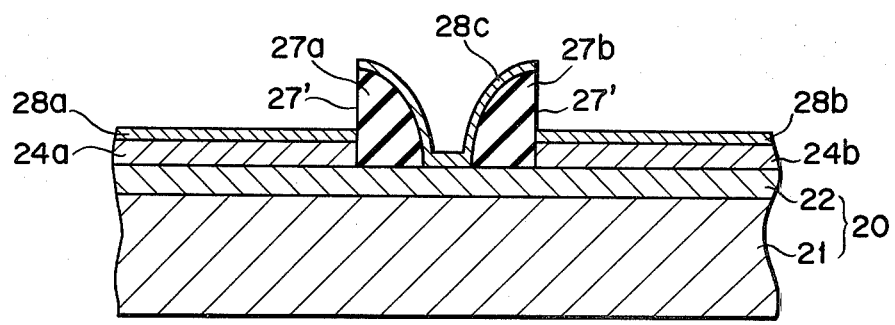
F I G. 2G
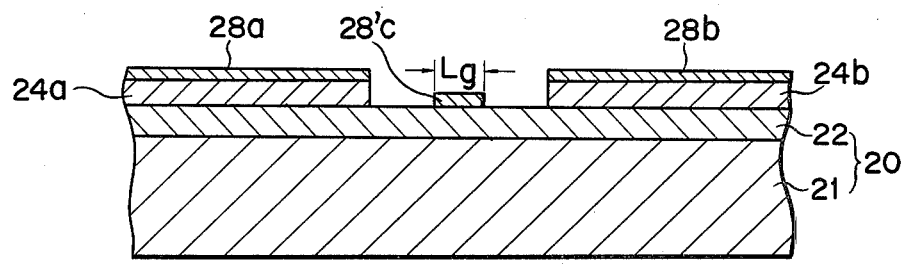

METHOD OF FABRICATING A SCHOTTKY GATE FIELD EFFECT TRANSISTOR

BACKGROUND OF THE INVENTION

I. Field of the Invention

This invention relates to a method of fabricating a Schottky gate field effect transistor (FET), and more particularly, to a method of fabricating a Schottky gate field effect transistor based on a III–V Group compound semiconductor.

II. Description of the Prior Art

Among the III–V Group compound semiconductors, a Schottky gate field effect transistor (also referred to as a "metal semiconductor (MES)FET") based on gallium arsenide (GaAs) has an excellent high frequency property and is widely accepted as a discrete semiconductor element constituting a high frequency amplifier or oscillator. Recently, this GaAs MESFET has played an important role as a basic element of a gallium arsenide integrated circuit (GaAs IC).

As is well known in the art, the figure of merit of MESFETs in high frequency bands is expressed as Cgs/gm (where Cgs denotes the capacitance between the gate and source, and gm represents mutual conductance). It can be understood that the figure of merit can be improved by reducing the gate-source capacitance and/or enlarging the mutual conductance. The mutual conductance gm is expressed by the following formula:

$$gm = gm_0/(1 + gm_0 Rs) \quad (A)$$

where:
$gm_0$ = intrinsic mutual conductance determined from the property of the channel section of the MESFET
Rs = series resistance between the source and gate.

It is seen that in practice, the mutual conductance gm is reduced to a smaller value than a maximum value $gm_0$ due to the presence of the parasitic resistance Rs. For enlargement of the mutual conductance gm, therefore, it is necessary to reduce Rs, and consequently, to reduce the distance between the source and gate. Alternatively, the enlargement of the mutual conductance gm can also be effected by increasing $gm_0$.

It is known that the source-gate capacitance Cgs is proportional to a gate length Lg, and the intrinsic mutual conductance $gm_0$ is inversely proportional to the gate length Lg. Therefore, the shortening of the gate length Lg can reduce the source-gate capacitance Cgs and enlarge the mutual conductance gm.

In order to improve the high frequency property of the MESFET, therefore, it is necessary to develop a technique to reduce parasitic resistance and/or to shorten the gate length.

Self-alignment methods have attracted attention as useful means for reducing parasitic resistance. A typical process of this type is, for example, the type which utilizes the overhang of a photoresist as set forth in, for example, Electronics Letters, December 1981, pp. 944–945. Description will now be given with reference to FIGS. 1A to 1C of the fundamental steps of the process. Referring to FIG. 1A, a metal layer 13 used as a gate electrode is deposited on the surface of an active layer 12 formed on a GaAs substrate 11. A patterned photoresist 14 having a width L is formed on the metal layer 13. This metal layer 13 is selectively removed by isotropic etching with the photoresist 14 used as a mask. As a result, overhanging portions 14a, 14b corresponding to the extent ($\Delta x$) of the lateral etching of the metal layer 13 are formed in the photoresist 14 (FIG. 1B). The remaining portion 13a of the metal layer 13 is the gate electrode. An ohmic-contacting metal layer is deposited on the structure shown in FIG. 1B. This ohmic-contacting metal layer is divided by the photoresist 14 into two portions 15a, 15b on the active layer 12. A separate portion 15c of the ohmic-contacting metal layer is formed on the photoresist 14 (FIG. 1C). Finally, the photoresist 14, together with the overlying separate metal layer 15c, is removed to finish the MESFET.

According to the above-mentioned process, the distance between the source and gate electrodes and the distance between the gate and drain electrodes are defined by a relatively small extent ($\Delta x$) of lateral etching. Therefore, the source and drain electrodes can be set close to the gate electrode, thereby reducing parasitic resistance. Further, the above-mentioned process has the advantage that the gate length can be shortened to that which is arrived at by subtracting twice the extent ($\Delta x$) of the lateral etching from the width L of the photoresist 14. In other words, the aforementioned process indeed has the merit of satisfying the two previously described requirements, but this process has the drawback that difficulties are presented in rigidly controlling the extent ($\Delta x$) to which the thin metal layer used as a gate electrode is isotropically etched laterally, resulting in a decline in reproducibility. Particularly with respect to GaAs LSI, the conventional process presents considerable difficulties in satisfying the requirements of fixing the gate lengths over the whole surface of a wafer.

SUMMARY OF THE INVENTION

It is accordingly the object of this invention to provide a method of fabricating a Schottky gate field effect transistor which can reduce a distance between source and gate electrodes and a distance between gate and drain electrodes and precisely control the gate length.

The process of fabricating a Schottky gate FET according to this invention comprises the steps of forming on a semiconductor body in a mutually facing relationship a first stack including a source electrode formed on the semiconductor body and a first spacer film formed on the planar surface of the source electrode and a second stack including a drain electrode formed on the semiconductor body and a second spacer film formed on the planar surface of the drain electrode. A continuous insulation layer is formed to substantially conform to the surface of the semiconductor body including the surfaces of the first and second stacks. The insulation layer is then anisotropically etched in the direction of its thickness, thereby allowing portions of the insulation layer to remain only on the mutually facing side walls of the first and second stacks and partially exposing the surface of the semiconductor body between the remaining portions of the insulation layer. Thereafter, the first and second spacer films are removed to expose the planar surfaces of the source and drain electrodes, thereby defining stepped portions between the remaining portions of the insulation layer and the surfaces of the respective electrodes.

A metallic material capable of forming a Schottky barrier with the semiconductor body is deposited on the whole surface of the structure obtained by the foregoing steps, thereby forming a layer of the metallic material which is discontinuous at the stepped portions. The remaining portions of the insulation layer are removed to pattern the metallic material layer, thereby providing a Schottky gate electrode on that portion of the surface of the semiconductor body which is defined between the source and drain electrodes. Thus, a desired Schottky gate field effect transistor is fabricated.

According to the method of this invention, a distance between the source and gate electrodes, a distance between the gate and drain electrodes and a gate length are defined by the width of those portions of an insulation layer remaining on the mutually facing side walls of the first and second stacks. The width of the remaining portions of the insulation layer is controlled by the thickness of the insulation layer which is formed to substantially conform to the surface of the semiconductor body. The recent technique of depositing an insulation layer by plasma chemical vapor deposition (plasma CVD) and the recent technique of anisotropic etching, particularly reactive ion etching can precisely control the width of those portions of the insulation layer remaining on the mutually facing side walls of the first and second stacks within an error range of 100 to 200 A or less. The control effected by the method of this invention is far better than the conventional process of defining a distance between the source electrode and gate electrode and a distance between the drain electrode and gate electrode by means of the lateral overetching of the gate electrode, utilizing isotropic etching.

As described above, the method of this invention very precisely controls a distance between the source electrode and gate electrode and a distance between the drain electrode and gate electrode. Therefore, the interelectrode distance is effectively reduced, enabling a MESFET having a small parasitic resistance to be fabricated with high reproducibility. The gate of the MESFET thus obtained has a length arrived at by subtracting a sum of the widths of both remaining portions of the insulation layer from a distance between the source and drain electrodes. Therefore, it is possible to easily realize a gate length on the order of submicrons, which is smaller than the shortest limit attained by photolithography.

BRIEF DESCRIPTION OF THE DRAWINGS

FIGS. 2A to 2G are cross-sectional views indicating the sequential steps of fabricating a MESFET by a method embodying this invention.

DETAILED DESCRIPTION OF THE PREFERRED EMBODIMENT

Description will now be given, with reference to FIGS. 2A to 2G, of a method embodying this invention for fabricating a MESFET. Throughout the drawings, the same parts are denoted by the same numerals.

Figure 1A:
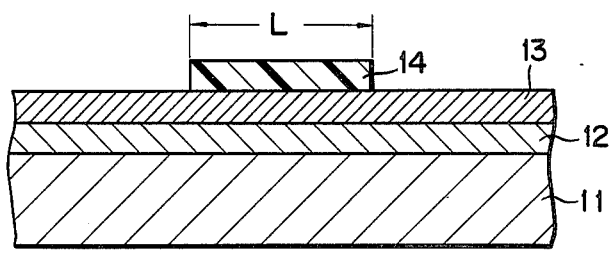
FIGS. 1A to 1C are cross-sectional views showing the conventional method of fabricating a MESFET.
Figure 1B:
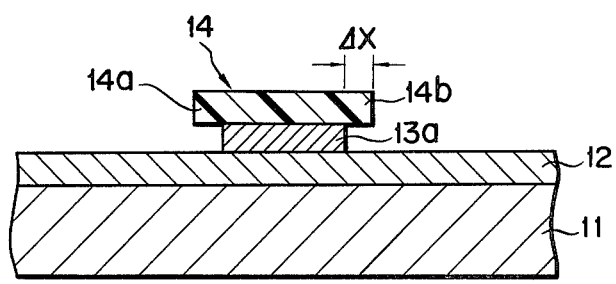
Figure 1C:
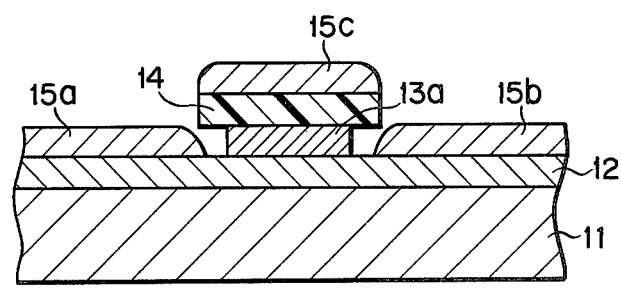
Figure 2A:
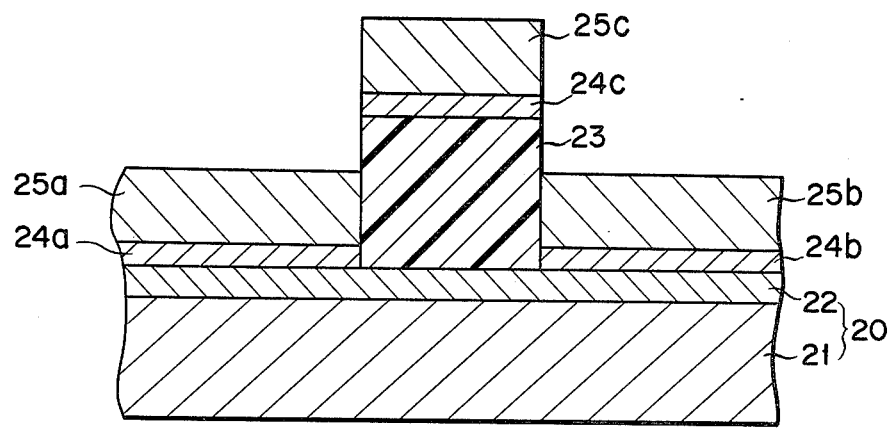

Referring to FIG. 2A, the surface of a semi-insulating GaAs substrate 21 doped with, for example, chromium is further doped with an impurity such as silicon by, for example, ion implantation to produce an active layer 22. Thus a prescribed semiconductor body 20, including both the substrate 21 and the active layer 22, is provided. A photoresist layer 23 having a width of, for example, 1.5 μm is selectively deposited on the prescribed portion of the active layer 22, with a relatively great thickness. On the surface of this structure, a metallic material capable of ohmic-contacting GaAs, for example, a gold-germanium alloy, is deposited to a thickness of, for example, 2,000 A. This Au-Ge alloy is deposited in three separate portions at 24a, 24b on the surface of the active layer 22 and at 24c on the planar surface of the photoresist layer 23. On the surface of the resultant structure, aluminum is vapor-deposited to a thickness of, for example, 6,000 A. Namely, the aluminum is laid in three separate portions by means of the photoresist layer 23 as indicated by 25a, 25b, 25c on the surface of the corresponding Au-Ge alloy layers 24a, 24b, 24c.

Figure 2B:
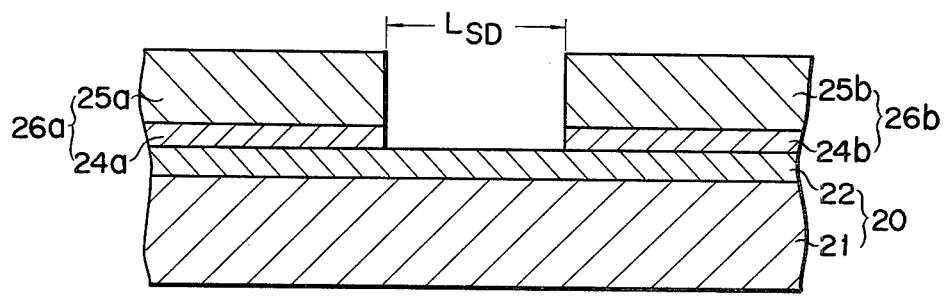

Thereafter, the photoresist layer 23 is removed together with the Au-Ge alloy layer 24c and an aluminum film 25c deposited on the photoresist layer 23. Thus, as shown in FIG. 2B, a first stack 26a comprised of the source electrode 24a and overlying aluminum spacer film 25a and a second stack comprised of the drain electrode 24b and overlying aluminum spacer film 25b are formed self-aligned. A distance $L_{SD}$ between the source electrode 24a and drain electrode 24b conforms to the width of the photoresist layer 23, i.e., 1.5 μm.

Figure 2C:
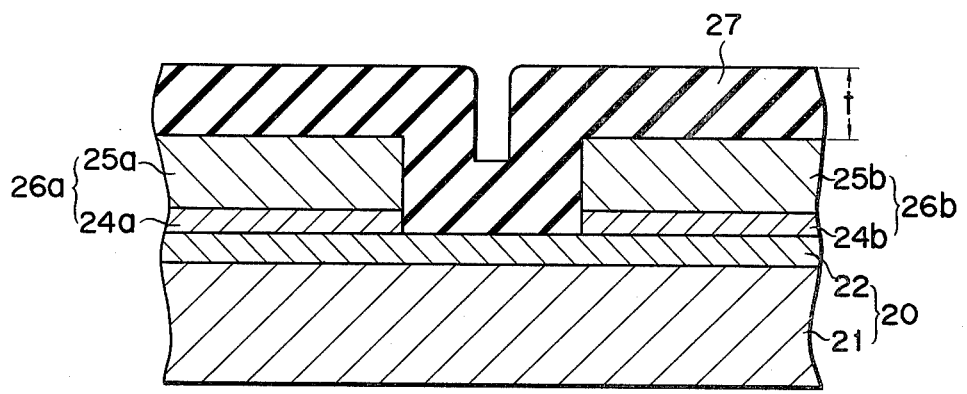

As seen from FIG. 2C, a continuous insulation layer 27 is deposited with a thickness of, for example, 4,000 A on the whole surface of the structure shown in FIG. 2B in conformity with the physical condition of the surface. This conforming or conformable formation of the insulation layer 27 can be effected by the plasma CVD process or a low temperature CVD process capable of effecting excellent step coverage. In this case, a plasma CVD silicon nitride layer or low temperature CVD silicon oxide layer is preferred.

The insulation layer 27 is anisotropically etched in the direction of its thickness to remove its planar portion. As shown in FIG. 2D, the separate portions 27a and 27b of the insulation layer 27 remain only on the mutually facing side walls of the first and second stacks 26a, 26b, respectively. The active layer 22 is partly exposed between the remaining portions 27a, 27b of the insulation layer 27. With the above-mentioned anisotropic etching, the width Δy of the retained portions 27a, 27b of the insulation layer 27 is substantially defined by the thickness t (FIG. 2C) of the insulation layer 27, namely, is set at, for example, about 4,000 A. This condition is ascertained by a scanning type electronic microscope.

The aluminum spacer films 25a, 25b are etched off by an aqueous solution of NaOH (FIG. 2E), for example. As a result, the sharply rising side walls of the remaining portions 27a, 27b of the insulation layer 27 are broadly exposed, forming stepped portions 27' between the source electrode 24a and the remaining portion 27a and also between the drain electrode 24b and the remaining portion 27b. The stepped portions 27' are formed on the remote sides of the remaining portions 27a, 27b.

Later, a metallic layer capable of constituting a Schottky barrier together with GaAs, for example, a platinum layer, is vapor-deposited to a thickness of, for example, 800 A on the whole surface of the structure of FIG. 2E. The platinum layer is made discontinuous by the aforesaid stepped portions 27' as seen from FIG. 2F. That is, the platinum layer is divided into three separate portions, namely, a portion 28a lying on the source electrode 24a, a portion 28b laid on the drain electrode 24b and a portion 28c deposited on the mutually facing sides of the remaining portions 27a, 27b of the insulation layer 27 and also on the exposed surface of the active layer 22.

Finally, the remaining portions 27a, 27b of the insulation layer 27 and those portions of the platinum layer 28c which are deposited on the remaining portions 27a, 27b are removed to pattern the platinum layer 28c. Thus, a gate electrode 28'c is formed on the active layer 22 between the source and drain electrodes. After an alloying step, a desired MESFET is fabricated (FIG. 2G). The gate of the MESFET thus obtained has a length Lg approximately expressed as $(L_{SD}-2\Delta y)$. In the foregoing embodiment, the gate length Lg measures about 0.7 μm (1.5 μm−0.4 μm×2). Variations in the gate lengths of FET's produced in the same wafer were inferred from the current-voltage characteristics of the FET's. It has been ascertained that in Schottky gate field effect transistors embodying this invention, variations in the gate lengths have been reduced to about half of what was observed in the conventional type.

Description has been made of the preferred embodiment of this invention. However, the invention is not limited to the embodiment described above. For instance, the semiconductor body may be prepared not only from GaAs but also from other semiconductors including III-V Group compound semiconductors, for example, indium phosphide (InP). Further, the active layer may be formed by epitaxial growth.

The spacer film need not be exclusively formed of aluminum, but may be prepared from any other metallic material, provided it satisfies the requirement that it can be selectively etched to a greater or lesser extent than the source and drain electrodes and the conforming insulation layer (for instance, at a rate as large as 3 to 10 times or more, or as small as one-third to one-tenth or less than that at which the above-listed elements are etched). In the foregoing embodiment, the stacks were formed by the lift-off method, but may be produced by the conventional photoetching process. In this case, the spacer film involved in the stack may be prepared from insulating material, provided it meets the above-mentioned requirement.

The thickness of the source, gate and drain electrodes and spacer film need not be limited to the description in the foregoing embodiment. Namely, the source and drain electrodes may be formed with a thickness ranging between 2,000 Å and 4,000 Å, and the gate electrode may be produced with a thickness ranging from 500 Å to 5,000 Å. The spacer film may be formed with a thickness ranging between 0.5 μm and 1.5 μm. The conforming insulation layer may be prepared with a thickness ranging from 3,000 Å to 10,000 Å. A distance between the source and drain electrodes may be set at a level ranging between 1.5 μm and 3 μm. Obviously, the above-mentioned measurements can be suitably chosen in accordance with the desired high frequency property of the subject Schottky gate field effect transistor.

What is claimed is:

1. A method of fabricating a Schottky gate field effect transistor which comprises the steps of:
    (a) forming on a III-V Group compound semiconductor body in mutually facing relationship, a first stack including a source electrode formed on the semiconductor body and a first spacer film formed on a planar surface of said source electrode; and a second stack including a drain electrode formed on the semiconductor body and a second spacer film formed on a planar surface of said drain electrode;
    (b) forming a continuous insulation layer on and substantially conforming to the surface of the semiconductor body including the surface of the first and second stacks;
    (c) anisotropically etching said insulation layer in the direction of its thickness, thereby allowing portions of said insulation layer to remain only on mutually facing side walls of the first and second stacks and exposing part of the surface of the semiconductor body between the remaining portions of the insulation layer;
    (d) removing the first and second spacer films to expose the planar surfaces of the source and drain electrodes, thereby defining stepped portions between the remaining portions of the insulation layer and the surfaces of the corresponding electrodes;
    (e) depositing on the whole surface of a structure obtained in step (d) a metallic material capable of constituting a Schottky barrier together with the semiconductor body, thereby forming a layer of said metallic material discontinuous at said stepped portions; and
    (f) removing the remaining portions of said insulation layer to pattern the layer of the metallic material, thereby forming a Schottky gate electrode on that portion of the surface of the semiconductor body which is defined between the source and drain electrodes.

2. The method according to claim 1, wherein the semiconductor body is formed of gallium arsenide.

3. The method according to claim 1, wherein the semiconductor body comprises a semi-insulating substrate and an overlying active layer.

4. The method according to claim 3, wherein the source and drain electrodes each comprise a gold-germanium alloy; and the gate electrode comprises platinum.

5. The method according to claim 1, wherein the spacer film is formed of material capable of being selectively etched with respect to the source and drain electrodes and insulation layer.

6. The method according to claim 5, wherein said first and second stacks are formed by forming a photoresist layer selectively on the prescribed portion of the surface of the semiconductor body; forming a layer of a metallic material capable of ohmic-contacting the semiconductor body on said semiconductor body and a planar surface of said photoresist layer; forming on said ohmic-contacting material layer a layer of material capable of being etched selectively with respect to said ohmic-contacting metallic material layer and said insulation layer; and removing the photoresist layer together with those portions of the ohmic-contacting metallic material layer and the layer of said material capable of being selectively etched which are deposited on said photoresist layer, thereby producing the first and second stacks.

7. The method according to claim 5, wherein the spacer film comprises a metallic material.

8. The method according to claim 5, wherein the spacer film comprises aluminum.

9. The method according to claim 5, wherein the spacer film comprises an insulating material.

10. The method according to claim 5, wherein the insulation layer is formed of silicon nitride deposited by plasma chemical vapor deposition.

11. The method according to claim 5, wherein the anisotropic etching is effected by reactive ion etching.

12. A method of fabricating a Schottky gate field effect transistor which comprises the steps of:

(a) forming first and second stacks in a facing relation on a semiconductor body comprising a substrate and an active layer formed on said substrate, said first stack comprising a first electrode layer ohmic-contacting said active layer and a first spacer film formed on a planar surface of said first electrode layer, and said second stack comprising a second electrode layer ohmic-contacting said active layer and a second spacer film formed on a planar surface of said second electrode layer;

(b) vapor-depositing a continuous insulating layer on the surface of the structure obtained in step (a);

(c) anisotropically etching said insulating layer in the direction of its thickness until planar surface portions of the structure obtained in step (b) are exposed, thereby allowing portions of said insulation layer to remain on facing side walls of said first and second stacks and partially exposing a surface of said active layer between said remaining portions of said insulation layer;

(d) removing said first and second spacer films to expose the planar surfaces of said first and second electrode layers and thereby defining stepped portions between said remaining portions of said insulation layer and the planar surfaces of said first and second electrode layers;

(e) vapor-depositing on a surface of the structure obtained in step (d) a layer of material capable of forming a Schottky barrier with said active layer and discontinuous at said stepped portions; and (f) removing said remaining portions of said insulation layer to pattern said layer of said material, thereby forming a Shottky gate electrode on said active layer between said first and second electrode layers.

13. The method according to claim 12, wherein said first and second electrode layers have a thickness of 2,000 A to 4,000 A.

14. The method according to claim 12, wherein said first and second spacer films have a thickness of 0.5 μm to 1.5 μm.

15. The method according to claim 12, wherein said insulation layer has a thickness of 3,000 A to 10,000 A.

16. The method according to claim 12, wherein said gate electrode has a thickness of 500 A to 5,000 A.

17. The method according to claim 12, wherein said first and second electrodes are spaced apart from each other at a distance of 1.5 μm and 3 μm.

* * * * *